KLYSTROM AMPLIFIER HAVING IMPROVED CAVITY RESONATOR APPARATUS

Filed Nov. 8, 1960

Inventors
Stanley E. Allen Jr.
Robert S. Symons
Thomas J. Connor
By Wm Nolan
Attorney 3,178,605
Patented Apr. 13, 1965

3,178,605

KLYSTRON AMPLIFIER HAVING IMPROVED CAVITY RESONATOR APPARATUS

Stanley E. Allen, Jr., Mountain View, Robert S. Symons, Menlo Park, and Thomas J. Connor, San Francisco, Calif., assignors to Varian Associates, Palo Alto, Calif., a corporation of California Filed Nov. 8, 1960, Ser. No. 68,037
12 Claims. (Cl. 315—5.46)

Figures 1, 2:
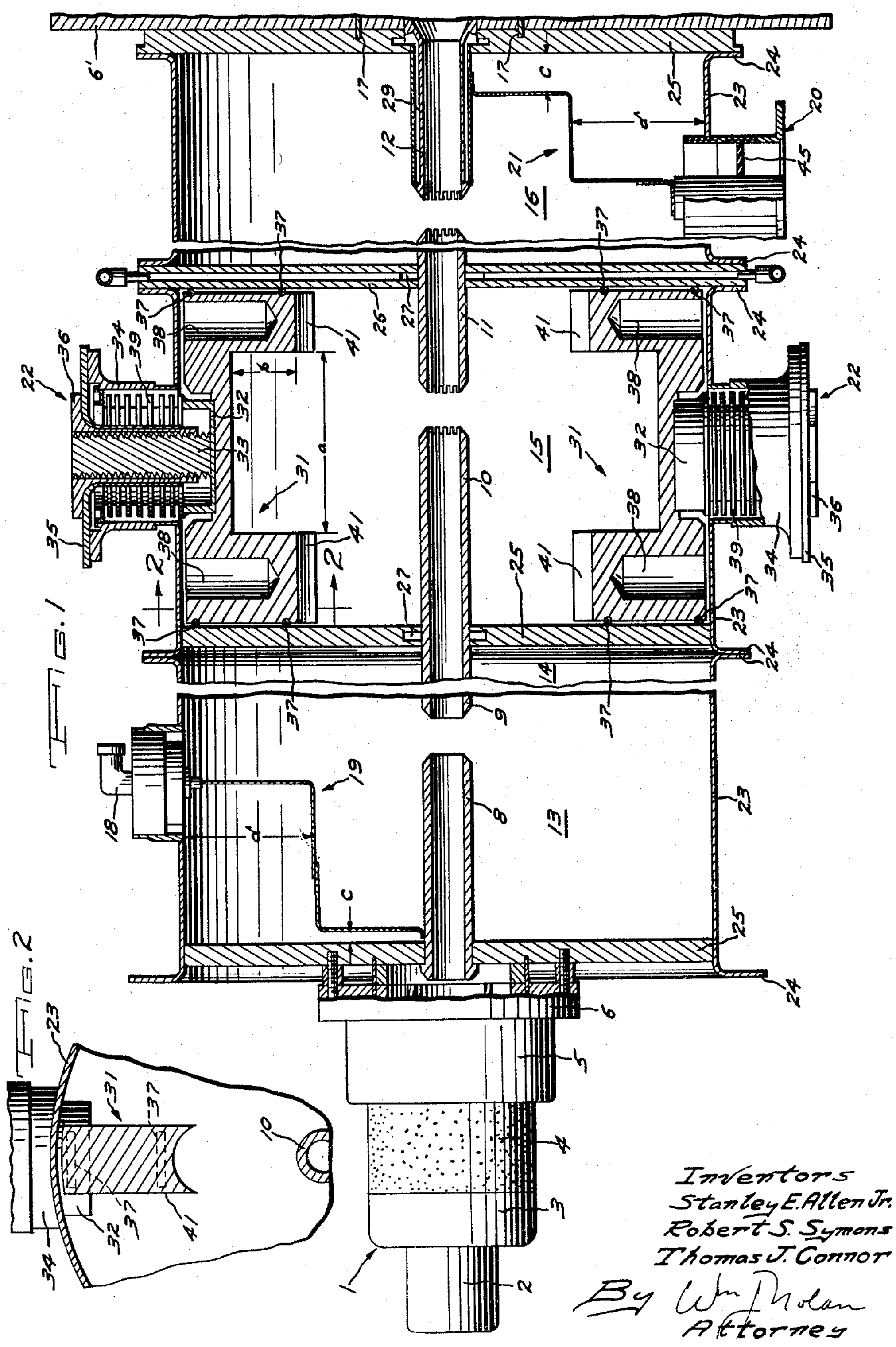

The present invention relates in general to high frequency cavity resonator apparatus as used, for example, in high power multi-cavity klystron amplifier tubes, and more particularly to a novel tunable cavity resonator exhibiting a substantial bandwidth over a wide tuning range.

In many applications it is desired to provide an amplifier tube which may be tuned over a wide frequency range with a substantially constant bandwidth. For example, in U.H.F. television transmission a need has arisen for a single high power klystron amplifier tube which may be tuned over the entire range of channels from 470 to 685 megacycles with a minimum bandwidth of 8 megacycles. This imposes corresponding tuning and bandwidth requirements on the cavity resonators of which the tube is comprised.

Heretofore, the necessary cavity resonator tuning range had been achieved with a tuner of the type disclosed in the copending application of Robert C. Schmidt et al., entitled "High Frequency Tube Apparatus," filed July 17, 1958, now U.S. Patent 2,994,009, issued July 25, 1961, in which both the inductance and capacitance of the cavity were simultaneously varied in the same sense to provide an accumulative tuning action with a limited amount of tuner motion. When it is simultaneously desired to maintain a fixed bandwidth over this tuning range, this type of tuner is subject to the undesirable limitation of a substantially constant cavity impedance $R_0$ and hence substantially constant percentage bandwidth over the tuning range. Thus, the absolute bandwidth at the low frequency end of the range is smaller than that at the high frequency end.

To overcome this limitation, it is necessary to provide a predominately inductive tuner in which the cavity impedance at the low end of the range is higher than that at the high end of the tuning range. However, conventional movable wall type inductive tuners, for example, are not capable of providing the necessary tuning range with a limited amount of tuner motion as required, for example, in a tube in which the cavity walls are part of the vacuum envelope.

Accordingly, one object of the present invention is the provision of an inductive type cavity resonator tuner which may be tuned over a wide range with a limited amount of tuner motion.

When, as above, a cavity resonator is used over a wide tuning range with a large variation in cavity impedance, a significant frequency variation in the coupling of the cavity to an external input or output transmission line is required in order to maintain a suitable impedance match. In particular, the requirement for a continuous impedance match is that the measured external "Q" vary over the frequency range according to the ratio $R/R_0$, where R is the electron beam loading in the case of an input cavity or the external load impedance in the case of an output cavity. Such matching is usually provided by an impedance transformer section external to the vacuum window sealing the cavity resonator from the transmission line, the window being designed so as to be considered reflectionless. The design of such a structure is undesirably complicated especially at very wide tuning ranges where considerable cut-and-try modifications are required to account for deviations from the assumed conditions.

Thus, a second object of the present invention is the provision of a simple structure for matching a cavity resonator to an external transmission line over a very wide tuning range.

One feature of the present invention is the provision of a wide range inductive tuner comprising a metallic tuning paddle movably supported at one edge thereof from the wall of a cavity resonator, said paddle having a cut-out portion recessed in the opposite edge thereof for providing a pair of inwardly directed finger members.

Another feature of the present invention is the provision of a tunable klystron cavity resonator having a pair of longitudinally aligned drift tube segments re-entrantly extending from the end walls thereof, and a metallic tuning paddle in accordance with the previous paragraph movably supported from a side wall thereof so that said finger members displace the high intensity magnetic field enclosing said drift tube segments near the junction of said end walls.

Another feature of the present invention is the provision of a tunable cavity resonator in accordance with the previous paragraph wherein said cavity resonator wall forms part of the vacuum envelope of said tube and said tuning paddle is supported in slightly spaced-apart relation relative to said end walls thereby avoiding arc-over and other problems characteristic of a metal-to-metal contact.

Still another feature of the present invention is the provision of a stepped internal coupling strap structure for matching a cavity resonator to an external transmission line over a wide frequency range.

These and other features and advantages of the present invention will become apparent upon a perusal of the following specification taken in connection with the accompanying drawings wherein:

FIG. 1 is a fragmentary cross sectional view of a klystron amplifier tube in accordance with the present invention, and FIG. 2 is a fragmentary cross sectional view taken along line 2—2 in FIG. 1.

The embodiment shown in FIGS. 1 and 2 as an example of the present invention is a 4-cavity klystron amplifier tube tunable over the range of 470 to 685 megacycles with a bandwidth of 8 megacycles and a continuous wave output power of 11.5 kilowatts.

The annular cathode assembly 1 comprising filament heater terminal 2, cathode terminal 3, ceramic high voltage insulator 4, seal protector 5 and pole piece 6, provides a pencil-like electron beam directed through a series of axially aligned drift tube segments 8, 9, 10, 11 and 12 re-entrantly extending into cavity resonators 13, 14, 15 and 16 to provide electron interaction gaps therein, said beam finally impinging on a water-cooled collector 17 (not shown in detail) mounted to the rear of output drift tube 12. The beam is accelerated by means of a negative voltage of approximately 12 kilovolts applied to cathode terminal 3 relative to the ground flared end of input drift tube 8, and is confined by a surrounding focusing electromagnet (not shown) mating with pole pieces 6 and 6'.

An electromagnetic wave which it is desired to amplify is applied through coaxial transmission line connector 18 and input coupling strap 19 to energize the input cavity resonator 13 and thereby velocity modulate the electron beam passing therethrough. Intermediate cavities 14 and 15, which serve to further velocity modulate the beam, are of similar construction and hence only cavity 15 is shown in detail. The velocity modulation of the beam is transformed in the field-free interior of the drift tubes into an intense current density modulation appearing at the output gap between drift tubes 11 and 12 thereby energizing the output cavity resonator 16 for providing a greatly amplified output electromagnetic wave to high power output coaxial line connector 20 via output coupling strap 21.

Each cavity resonator is provided with a pair of diametrically opposed tuner assemblies 22 to be described in detail subsequently. In order to simplify the drawing, only one such pair is shown and the coaxial connectors 18 and 20 are rotated by 90°. The frequencies of the various cavity resonators are thus stagger-tuned over the desired pass-band to provide a broad band response. In order to move the center of this pass-band to any desired frequency in the specified tuning range, the tuner assemblies 22 are characterized by an extremely wide tuning range as will become apparent.

The tube is assembled by means of a simple and rugged modular construction in which each module, comprising a tubular body segment 23 with outwardly directed end flanges 24, a cavity end wall header 25 centrally supporting a drift tube segment, and a pair of tuner assemblies 22, is assembled as a separate sub-assembly and then the separate modules are brazed together at flanges 24 whereby the number of vacuum-tight brazed joints is minimized and the replacement of defective parts is facilitated. Further the cylindrical body geometry minimizes the amount of material needed for the external focusing electromagnet. The module defining the output cavity 16 is of reversed configuration to permit the sub-assembly positioning of the coupling strap 21, as will be described subsequently, and is joined to the adjacent module via a cavity wall sandwich plate 26. The intermediate drift tubes 10 and 11 are fluid cooled through annular channels 27 in the end wall members 25 and 26, and the output drift tube 12, which tends to run hotter than the others, is cooled by means of an extensive cylindrical channel 29.

Referring now in detail to the tuner 22, a copper tuning paddle 31 is movably supported from the cavity wall 23 at one edge thereof through the successively brazed stainless steel plug 32 and stainless steel drive screw 33, the screw 33 being mounted in body flange 34 via stainless steel bearing member 35 and bronze tuning nut 36 forming a good bearing surface therewith. A thin, flexible stainless steel bellows 39 is welded in a vacuum-tight manner between opposed shoulder portions of members 32 and 34 to form part of the tube envelope. The tuner paddle 31 is captured against rotation by means of a pair of sapphire bearing rods 37 wedged between the cavity walls 25 and 26 and a pair of transversely extending grooves in the end surfaces of the paddle. Holes 38 are drilled into the tuning paddle 31 to conveniently reduce the weight thereof.

In operation, the tuning nut 36 is rotated whereby translational motion is imparted to the tuner paddle 31 via screw 33 and plug 32. Thus, paddle 31 slides on the sapphire rods 37, advantageously avoiding metal-to-metal contact with the cavity side walls 25 and 26, to a position which establishes the desired frequency for the cavity resonator.

The free edge of tuning paddle 31 has a cut-out portion of dimensions $a$ by $b$ recessed therein to provide a pair of inwardly extending finger members 41 with each finger member serving to displace the high intensity magnetic field surrounding the axially aligned and spaced apart drift tube segments 10 and 11 within the cavity resonator 15 near the junction of end walls 25 and 26. Translation of the paddle 31 transverse to the axis of the cavity 15 varies the displacement of this high intensity magnetic field thereby establishing the desired wide inductive tuning range with a minimum of tuner motion. As seen in FIG. 2, the ends of fingers 41 are shaped to conform to the contour of the drift tube segments thereby permitting maximum inward travel.

In order to extend the low frequency end of the tuning range and also to obtain the highest possible low frequency $R_0$, it is desirable to have the paddle 31 occupy the smallest possible space and still be effective in displacing the magnetic field for tuning the cavity to the higher frequencies. This is achieved in practice by limiting the thickness of the paddle to approximately the diameter of the drift tube as seen in FIG. 2. Further, the most favorable tuning range has been found to exist when the dimension $a$ of the cut-out is about twice the dimension $b$, the dimension $b$ being large enough to avoid substantial changes in the capacitance across the electron interaction gap when the paddle is fully inserted. To a limited extent, the two ends of the frequency range can be simultaneously raised or lowered by varying the area of the cut-out. A larger cut-out reduces the space occupied by the paddle thereby lowering the low frequency end, and also enlarges the space into which the magnetic field is displaced when the paddle is fully inserted thereby lowering the high frequency end; and, conversely, a smaller cut-out raises both end frequencies.

Referring more particularly to the illustrated embodiment, it will be noted that the drift tube gaps are placed somewhat off-center in order to lower the frequency of the cavity resonators without increasing the size thereof. Thus, the cut-out portion of the paddle 31 is also placed off-center so as to avoid interference with the capacitive gap region. When the upper and lower tuners are each moved a distance of 2.5″, a tuning range in excess of 1.55 to 1 is obtained with a low frequency $R_0$ of 200 and a high frequency $R_0$ of 110. Higher values of $R_0$ with a corresponding decrease in the tuning range are obtainable by using only a single one of the tuners 22.

Since the beam focusing field tends to focus secondary electrons across the gap between the tuner paddle 31 and the cavity end walls 25 and 26, some care must be exercised to limit the size of this gap to a maximum value at which multipactor power losses begin to set in. A useful expression for this maximum gap distance is $$d=\frac{V}{(7.15\times10^{-15})f^2}$$

where $d$ is the gap spacing in centimeters, V is the R.F. voltage across the gap, and $f$ is the cavity frequency in megacycles. In the illustrative embodiment, a maximum spacing of .173 centimeter with $V=100$ volts and $f=685$ megacycles is readily obtainable. Under some operating conditions, it may be advantageous, however, to use flexible grounding straps or sliding contacts to avoid the multipactor problem.

Referring now to the coupling straps 19 and 21, these conveniently consist of one or more brazed-together copper strap sections arranged in a stepped configuration between the inner conductor of the coaxial connectors 18, 20 and drift tube segments 8, 12. In this manner, the area of the coupling loop between the straps and the adjacent cavity walls is controllably varied as a function of tuner position to give the desired variation of coupling over the tuning range. Referring in particular to the illustrated embodiment, the magnetic field at the high frequency end of the tuning range predominately links the small inner loop area thereby yielding the desired small coupling (large measured external "Q"), whereas the linkage at the low frequency end is through the entire loop thereby giving the desired large coupling (small measured external "Q"). With this coupling strap arrangement a vacuum window such as 45 of any convenient configuration may be selected, and the loop dimensions $c$ and $d$ varied until the desired external "Q" variation over the tuning range is obtained. This adjustment can be carried out quite simply since changing the dimension $c$ will vary the coupling at the high frequency end of the tuning range without substantially effecting the coupling at the low frequency end, and similarly changing the dimension $d$ will effect primarily only the low frequency coupling.

To insure maximum control of coupling with a simple variation of the two dimensions $c$ and $d$, it is desirable that the wide dimension of the coupling strap (into the plane of the page) be sufficiently large that coupling variations due to the self-inductance of the strap are eliminated. For example, in the illustrated embodiment, a coupling strap 1/16" thick by 1.135" wide was advantageously used.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. In a klystron tube, the combination comprising: a structure forming the conducting boundaries of a cavity resonator including opposed end walls and a surrounding side wall; a pair of axially-aligned drift tube segments extending from said end walls and defining an axis of said cavity resonator and an electron interaction gap therebetween; and an inductive tuning paddle movably supported at one edge thereof from said side wall, the opposite edge of said paddle having a cut-out portion recessed therein for providing a pair of inwardly directed finger members which respectively are axially spaced apart in said cavity resonator with each finger being disposed adjacent a different one of said drift tube segments to displace the high intensity magnetic field enclosing each drift tube segment near the junction of said end walls.

2. The combination of claim 1 wherein said cavity resonator structure is evacuated and the ends of said paddle are slideably mounted in slightly-spaced relation relative to said end walls by means of non-metallic bearing members disposed inbetween said paddle and said end walls.

3. The combination of claim 1 wherein the opposite edge of said tuning paddle is parallel to said drift tube segments and the thickness of said paddle is approximately equal to the diameter of said segments.

4. The combination of claim 1 wherein the length of said cut-out taken in the axial direction in said cavity resonator is approximately twice the depth thereof.

5. The combination of claim 1 wherein a tuning paddle as defined in said claim is supported from each of two opposed side wall portions, the finger members of each paddle being aligned with the corresponding finger members of the opposite paddle.

6. In a high power klystron amplifier tube tunable over a wide frequency range with a substantially constant bandwidth, the combination comprising: a series of aligned evacuated structures forming the conducting boundaries of cavity resonator, each of said structures including opposed end walls and a surrounding side wall; a pair of axially aligned drift tube segments extending from each opposed pair of end walls and defining an axis of said cavity resonator and an electron interaction gap therebetween; and a pair of tuner assemblies mounted on opposed portions of the side wall of at least one of said cavity resonator structures, each tuner assembly comprising an inductive tuning paddle movably supported at one edge thereof from said side wall portion and being movable in a direction transverse to the axis of said cavity resonator for tuning, the opposite edge of said paddle having a cut-out portion recessed therein for providing a pair of inwardly directed finger members which respectively displace the high intensity magnetic field enclosing each drift tube segment near the junction of said end walls and which fingers in each tuner assembly are axially spaced apart in said cavity resonator and each of said fingers in each tuner assembly being disposed adjacent a different one of said drift tube segments.

7. The combination of claim 6 wherein the ends of said paddles are slideably mounted in slightly-spaced apart relation relative to said end walls by means of sapphire bearing members disposed inbetween said end walls and said paddles.

8. The combination of claim 6 wherein the first and last cavity resonator structure of said series includes a stepped coupling strap extending between said side wall and one of said drift tube segments.

9. In combination: a cavity resonator wall structure with intersecting surfaces; tuning means movably mounted within said structure for varying the frequency thereof; and a coupling conductor having separate portions substantially parallel to and variably spaced from said surfaces to define an irregularly shaped coupling loop bounded by said coupling conductor and said structure whereby the coupling to said conductor is varied as a function of frequency.

10. The combination of claim 9 wherein said coupling conductor is of a stepped configuration.

11. In a klystron tube, the combination comprising: a structure forming the conducting boundaries of a cavity resonator including opposed end walls and a surrounding side wall; a pair of axially-aligned drift tube segments reentrantly extending from the end walls of said cavity resonator structure and defining an electron interaction gap therebetween; a tuning member movably extending from said side wall for varying the frequency of said cavity resonator structure; and a stepped coupling strap having a first portion extending inwardly from said side wall, a second portion extending axially from said first portion toward one end wall, and a third portion extending inwardly from said second portion to the drift tube segment which extends from said one end wall, the distance between said second strap portion and said side wall predominately determining the low frequency coupling to said strap and the distance between said third strap portion and said one end wall predominately determining the high frequency coupling to said strap.

12. The combination of claim 11 wherein said tuning member is a metallic paddle supported at one edge thereof, the opposite edge of said paddle having a cut-out portion recessed therein for providing a pair of inwardly directed finger members which respectively displace the high intensity magnetic field enclosing each drift tube segment near the junction of said end walls.

References Cited by the Examiner

UNITED STATES PATENTS

| | | | |
|---|---|---|---|
| 2,939,036 | 5/60 | Nelson | 315—5.47 |
| 2,945,156 | 7/60 | Arnold et al. | 315—5.48 X |
| 2,963,616 | 12/60 | Nelson et al. | 315—5.48 X |
| 2,968,013 | 1/61 | Auld | 333—83 |
| 2,994,009 | 7/61 | Schmidt et al. | 315—5.48 |
| 3,078,385 | 2/63 | Sorg et al. | 315—5.48 |

GEORGE N. WESTBY, *Primary Examiner.*

ARTHUR GAUSS, *Examiner.*